(12) United States Patent
Komamaki

(10) Patent No.: US 8,115,913 B2
(45) Date of Patent: Feb. 14, 2012

(54) LIGHT PULSE GENERATOR AND OPTICAL TIME DOMAIN REFLECTOMETER USING THE SAME

(75) Inventor: Moritoshi Komamaki, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 12/856,877

(22) Filed: Aug. 16, 2010

(65) Prior Publication Data

US 2011/0043790 A1    Feb. 24, 2011

(30) Foreign Application Priority Data

Aug. 18, 2009    (JP) .................................. 2009-189293

(51) Int. Cl.
*G01N 21/00* (2006.01)
(52) U.S. Cl. ...................................................... 356/73.1
(58) Field of Classification Search .................. None
See application file for complete search history.

(56) References Cited

U.S. PATENT DOCUMENTS

| | | | | | |
|---|---|---|---|---|---|
| 4,549,783 | A | * | 10/1985 | Schmachtenberg, III | ...... 385/88 |
| 5,729,562 | A | * | 3/1998 | Birx et al. | ........... 372/38.04 |

FOREIGN PATENT DOCUMENTS

| | | |
|---|---|---|
| JP | 2008-089336 A | 4/2008 |
| JP | 2008-107319 A | 5/2008 |
| JP | 2008-235701 A | 10/2008 |

OTHER PUBLICATIONS

Japanese Office Action issued on Jun. 21, 2011 in the corresponding Japanese Patent Application No. 2009-189293.

* cited by examiner

*Primary Examiner* — Tu Nguyen
(74) *Attorney, Agent, or Firm* — Sughrue Mion, PLLC

(57) ABSTRACT

There is provided a light pulse generator. The light pulse generator includes: a laser diode; a voltage source that provides a bias voltage to the laser diode; a switching element that causes the laser diode to emit a light pulse by directly modulating the laser diode; and an auxiliary current circuit which starts to charge immediately after turn-on of the switching element and which starts to discharge after a forward current flows through the laser diode so as to provide a auxiliary current to the laser diode in the same direction as the forward current.

4 Claims, 10 Drawing Sheets

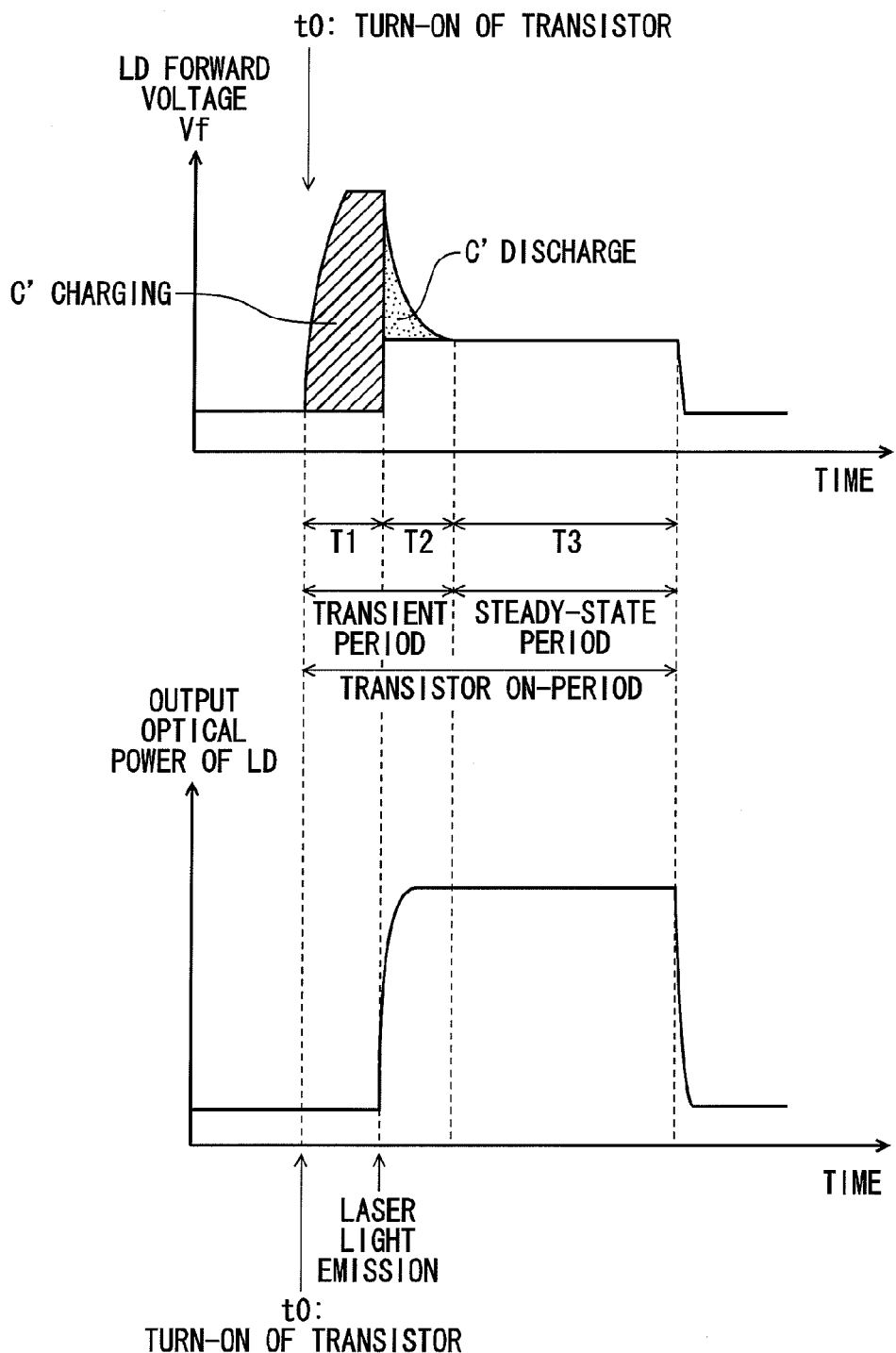

(A) BEFORE CURRENT FLOWS THROUGH LD11 (CAPACITOR C' IS CHARGED)

(B) AFTER CURRENT STARTS FLOWING THROUGH LD11 (CAPACITOR C' IS DISCHARGED)

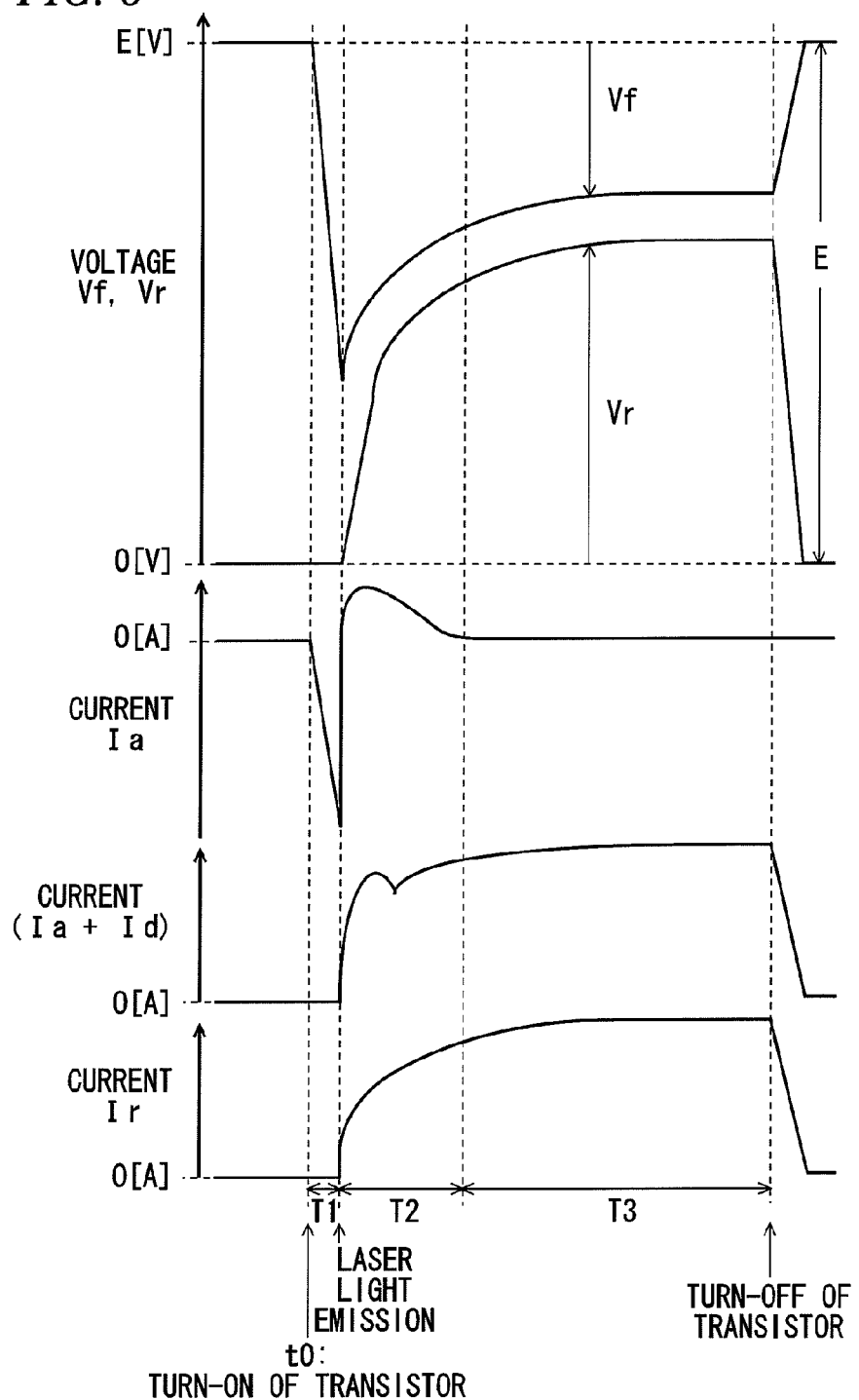

WITHOUT AUXILIARY CURRENT CIRCUIT

WITH AUXILIARY CURRENT CIRCUIT $L' = L1+L2+L3+L4$ ⋯ (1)
$Id = Ton \cdot (E1-Vf)/L'$ ⋯ (2)

PRIOR ART

PRIOR ART

LIGHT PULSE GENERATOR AND OPTICAL TIME DOMAIN REFLECTOMETER USING THE SAME

This application claims priority from Japanese Patent Application No. 2009-189293, filed on Aug. 18, 2009, the entire contents of which are incorporated by reference herein.

BACKGROUND OF THE INVENTION

1. Technical Field

The present disclosure relates to a light pulse generator and an optical time domain reflectometer using the light pulse generator. More specifically, the present disclosure relates to a light pulse generator which outputs light pulses having a steep rising edge and an optical time domain reflectometer using the light pulse generator.

2. Related Art

In optical communication systems which perform a data communication using an optical signal, it is important to monitor optical fibers for transmitting optical signals. An optical time domain reflectometer (hereinafter abbreviated as "OTDR") is used in installation, maintenance or the like of optical fibers.

The OTDR performs measurements relating to a disconnection, a loss or the like of an optical fiber to be measured by providing repetitive light pulses to the optical fiber from a measurement connector provided at the entrance/exit end of the OTDR and measuring levels and reception times of return light beams (reflection light beams, back scattering light beams, etc.) coming from the optical fiber.

A light pulse generator is used in OTDRs as a light source for emitting light pulses to an optical fiber to be measured (see JP-A-2008-089336 and JP-A-2008-107319, for example).

FIG. 9 is a circuit diagram showing the configuration of a related-art light pulse generator. As shown in FIG. 9, the light pulse generator includes: a laser diode 11; a transistor 12; a constant current source 13; a constant voltage source 14; and a modulation control signal source 15. The light pulse generator emits light pulses. The laser diode 11, the transistor 12, the constant current source 13, and the constant voltage source 14 form a closed loop.

The laser diode (LD) 11 emits light pulses for measurement of an optical fiber.

The transistor 12, which is a switching element, is turned on/off (i.e., conduction between its collector and emitter is established/canceled) in response to a control signal that is provided to the base from the modulation control signal source 15. The collector of the transistor 12 is connected to the cathode of the LD 11.

The constant current source 13, one end of which is connected to the emitter of the transistor 12, causes a flow of a constant emitter current while the transistor 12 is on ((emitter current)≅(collector current)).

The constant voltage source 14, the positive pole side of which is connected to the anode of the LD 11, forward-biases the LD 11.

The modulation control signal source 15 provides, to the base of the transistor 12, a modulation control signal for turning on/off the transistor 12.

The closed loop formed by the LD 11, the transistor 12, the constant current source 13, and the constant voltage source 14 will be hereinafter referred to as a forward current loop. A current that flows through the LD 11 in the forward direction in the forward current loop will be hereinafter referred to as an LD forward current Id.

The components 11-14 are mounted on a printed circuit board(s) or the like and electrically connected to each other by printed interconnections on the board, cables connecting the boards, etc. As a result, inductances L1-L4 occur in the interconnections and cables connecting the components 11-14. In other words, the series wiring inductances L1-L4 exist in the forward current loop.

The operation of the above laser pulse generator will be described below.

The modulation control signal source 15 provides, to the base of the transistor 12, a modulation control signal for turning on/off the transistor 12. The transistor 12 is turned on when the level of the modulation control signal is changed from low to high, and the transistor 12 is kept on while the modulation control signal is kept at the high level.

While the transistor 12 is on, the LD 11 is forward-biased by the constant voltage source 14 and the LD forward current Id (the constant current of the constant current source 13) flows through the LD 11. The LD 11 emits laser light if the LD forward current Id is larger than its threshold current.

On the other hand, the transistor 12 is turned off when the level of the modulation control signal supplied from the modulation control signal source 15 is changed from high to low, and the transistor 12 is kept off and the forward current loop is kept open while the modulation control signal is kept at the low level. In this state, the LD forward current Id is shut off and the LD 11 does not emit laser light.

As described above, the LD forward current Id of the LD 11 is caused to flow or shut off by tuning on or off the transistor 12. The LD 11 is caused to emit light pulses by directly intensity-modulating in the LD 11.

FIG. 10 is a graph showing a laser light emission characteristic of the LD 11, wherein the horizontal axis represents the LD forward current Id and the vertical axis represents the laser output optical power. The laser output power increases as the LD forward current Id increases after it exceeds the threshold current.

To cause the LD 11 to emit a light pulse, it is necessary to cause a pulse-shaped LD forward current that is proportional to an optical power of laser light to flow through the LD 11. It is possible, by using electronic components on the market, to cause the modulation control signal source 15 to generate a control signal having a pulse width of several nanoseconds and provide it to the transistor 12 and to cause the transistor 12 to be turned on/off in response to such a modulation control signal.

On the other hand, the printed circuit board on which the components 11-14 are mounted and the components 11-14 themselves have the inductances L1-L4 as shown in FIG. 9.

An inductance L' in the forward current loop and the LD forward current Id which flows through the forward current loop while the transistor 12 is on are given by the following Equations (1) and (2), respectively.

$$L' = L1 + L2 + L3 + L4 \qquad (1)$$

$$Id = \mathrm{Ton} \cdot (E1 - Vf)/L' \qquad (2)$$

In Equations (1) and (2), L' is a combined wiring inductance of the inductances L1-L4. Ton is the elapsed time from turn-on of the transistor 12, E1 is the voltage of the constant voltage source 14, and Vf is the voltage between the two terminals of the LD 11 (i.e., the forward voltage of the LD 11).

Therefore, ΔId/ΔTon is restricted by the forward current loop during a period from turn-on of the transistor 12 to a start of laser light emission of the LD 11. That is, it is difficult to generate a laser light pulse having a steep rising edge using a large current.

Further, it is difficult to remove the inductances of the components 11-15 and the printed circuit board on which they are mounted, and hence shortening of the width of a light pulse becomes more difficult as the necessary LD forward current Id increases (i.e., as the necessary output optical power of the LD 11 increases).

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an illustrative aspect of the present invention to provide a light pulse generator capable of outputting a light pulse having a steep rising edge and an optical time domain reflectometer using such a light pulse generator.

According to one or more illustrative aspects of the present invention, there is provided a light pulse generator. The light pulse generator includes: a laser diode; a voltage source that provides a bias voltage to the laser diode; a switching element that causes the laser diode to emit a light pulse by directly modulating the laser diode; and an auxiliary current circuit which starts to charge immediately after turn-on of the switching element and which starts to discharge after a forward current flows through the laser diode so as to provide a auxiliary current to the laser diode in the same direction as the forward current.

According to one or more illustrative aspects of the present invention, there is provided an optical time domain reflectometer which provides a light pulse to an optical fiber and measures a characteristic of the optical fiber based on return light of the light pulse, coming from the optical fiber. The reflectometer includes: the light pulse generator.

Other aspects of the invention will be apparent from the following description, the drawings and the claims.

BRIEF DESCRIPTION OF THE DRAWINGS

FIG. 2 shows waveforms of a forward voltage and output optical power of a laser diode of the light pulse generator shown in FIG. 1;

FIG. 6 schematically shows relationships between various voltages and currents in the light pulse generator shown in FIG. 1 in the case of low-voltage driving of the laser diode;

DETAILED DESCRIPTION OF EXEMPLARY EMBODIMENTS

Embodiments of the present invention will be now described in detail with reference to the drawings.

Figure 1:
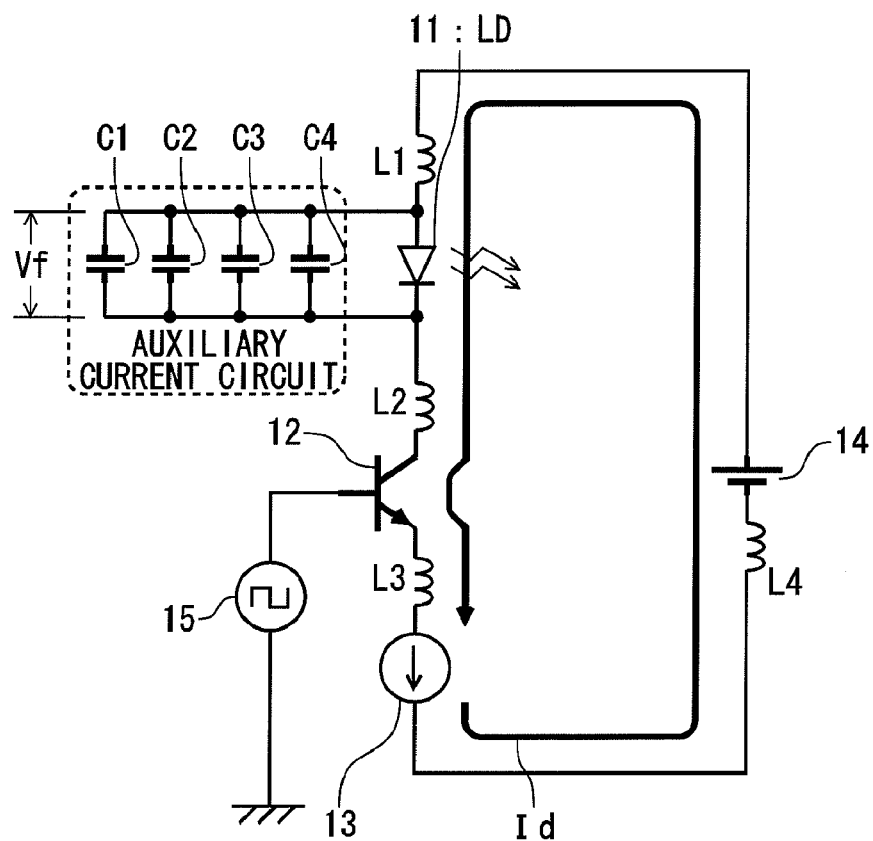
FIG. 1 is a circuit diagram showing the configuration of a light pulse generator according to an embodiment of the present invention.

FIG. 1 is a circuit diagram showing the configuration of a light pulse generator according to an embodiment of the invention. The same components as those in FIG. 9 will be given the same reference symbols as the latter and will not be described in detail.

As shown in FIG. 1, capacitors C1-C4 are provided in parallel with the LD 11. Although in FIG. 1 the four capacitors C1-C4 are provided in parallel with the LD 11, the number of such capacitors may be any number, that is, may be either one or a plural number.

The capacitors C1-C4 correspond to the term "auxiliary current circuit".

The operation of the above-configured light pulse generator will be described below. FIG. 2 shows waveforms of a forward voltage and output optical power of the LD 11. The horizontal axes represent time, and the vertical axes represent the forward voltage (bias voltage; Vf in FIG. 1) provided to the LD 11 and the output optical power of the LD 11.

Firstly, a description will be made of a transient characteristic (a transient period shown in FIG. 2) of the forward voltage of the LD 11 when it starts light emission.

The modulation control signal source 15 provides, to the transistor 12, a modulation control signal for turning on and off the transistor 12. When the modulation control signal is at the low level, the transistor 12 is off and hence the LD 11 is in the unbiased state (no bias voltage is supplied from the constant voltage source 14). When the modulation control signal is changed from the low level to the high level, the transistor 12 is turned on.

The LD 11 starts to be driven from the unbiased state, and the differential resistance (initial differential resistance) of the LD 11 is very large immediately after the turn-on of the transistor 12 (time t0 (see FIG. 2)), that is, immediately after the application of a bias voltage. Therefore, almost no LD forward current Id flows through the LD 11. As a result, immediately after the turn-on of the transistor 12 (in the period when the differential resistance is large), a large voltage drop occurs between the two terminals of the LD 11. The term "large" is a result of comparison with a voltage drop between the two terminals of the LD 11 in a steady state (a steady-state period is shown in FIG. 2).

After a lapse of a prescribed time from the turn-on of the transistor 12, a current starts flowing through the LD 11 and the resistance of the LD 11 decreases rapidly. The LD forward current Id increases quickly and exceeds the threshold current, whereupon the LD 11 starts to emit laser light. In the light emission steady state, the voltage between the two terminals of the LD 12 (forward voltage Vf) has a constant value. The LD 11 is forward-biased by the constant voltage source 14 and a constant LD forward current Id of the constant current source 13 flows through the LD 11. The LD 11 continues to emit laser light as long as the LD forward current Id is larger than the threshold current.

Figure 3A:
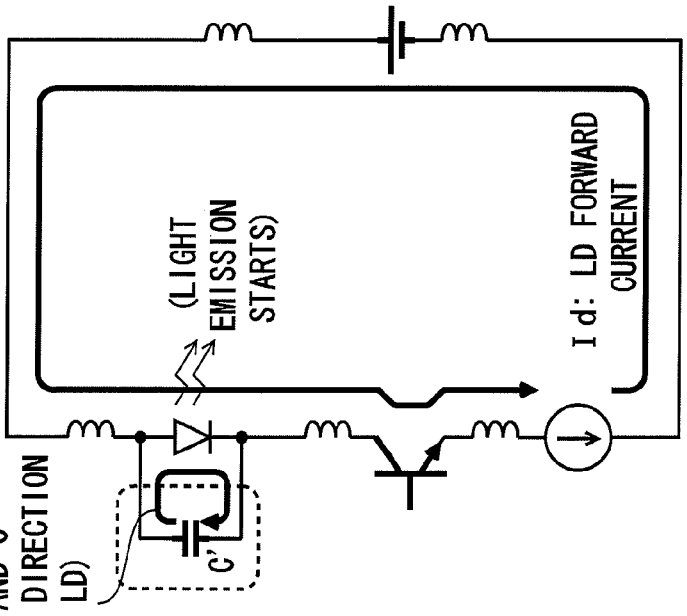
FIGS. 3A and 3B are circuit diagrams showing how capacitors (auxiliary current circuit) are charged and discharged in the light pulse generator shown in FIG. 1.
Figure 3B:
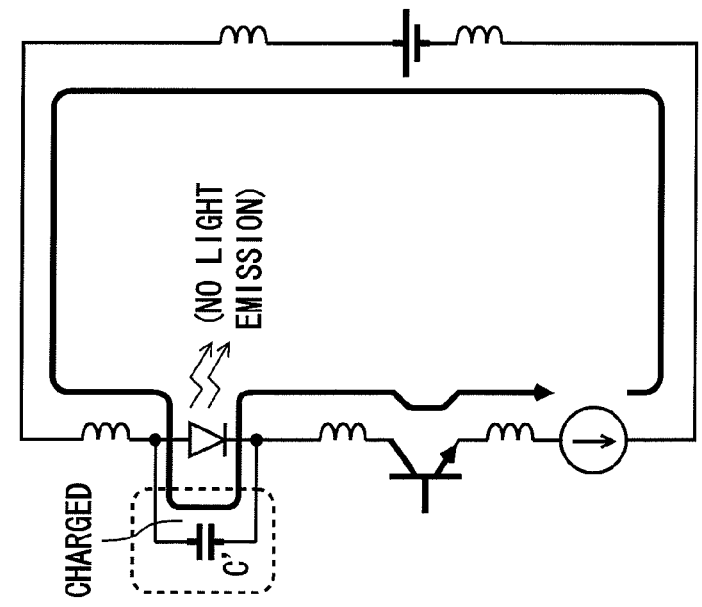

Next, the operation of the capacitors C1-C4 (auxiliary current circuit) will be described. FIGS. 3A and 3B are circuit diagrams showing how the capacitors C1-C4 are charged and discharged. In FIGS. 3A and 3B, the capacitors C1-C4 are together represented by a capacitor C'.

As described above, in the activation transient period, the LD 11 exhibits a light emission forward voltage transient characteristic. Therefore, while the transistor 12 which is connected in series with the LD 11 is on and the differential resistance (initial differential resistance) of the LD 11 is large (a period T1 in FIG. 2), the capacitor C' which is connected in parallel with the LD 11 is charged to produce the forward voltage Vf. No laser light is emitted during this period.

When the LD forward current Id starts flowing through the LD 11, because of a second-phase of the light emission forward voltage transient characteristic of the LD 11 (a forward voltage attenuation characteristic with a rapid decrease of the resistance of the LD 11; a period T2 shown in FIG. 2), the forward voltage Vf becomes lower than a peak value in the period T1. The capacitor C' is discharged to cause an additional current Ia to flow through the LD 11. That is, in addition to the LD forward current Id, the auxiliary current Ia coming from the capacitor C' flows through the LD 11.

The inductance of the current path (called an auxiliary current path) consisting of the LD 11 and the capacitor C' is smaller than the series inductance L' of the forward current loop. As in the light pulse generator of FIG. 9, the LD forward current Id flowing through the forward current loop is affected by the series inductance L' and hence affected by $\Delta Id/\Delta Ton$ (immediately after activation). On the other hand, since the inductance of the auxiliary current path consisting of the LD 11 and the capacitor C' is smaller than the series inductance L', $\Delta Ia/\Delta Ton$ is larger than $\Delta Id/\Delta Ton$ (immediately after activation).

The LD 11 starts laser light emission when the auxiliary current Ia coming from the capacitor C' exceeds the threshold current of the LD 11. More strictly, the LD 11 emits laser light when the auxiliary current Ia plus the LD forward current Id exceed the threshold current. However, since as described above $\Delta Ia/\Delta Ton$ is larger than $\Delta Id/\Delta Ton$ immediately after activation, almost only the auxiliary current Ia contributes to the start of laser light emission.

Figure 10:
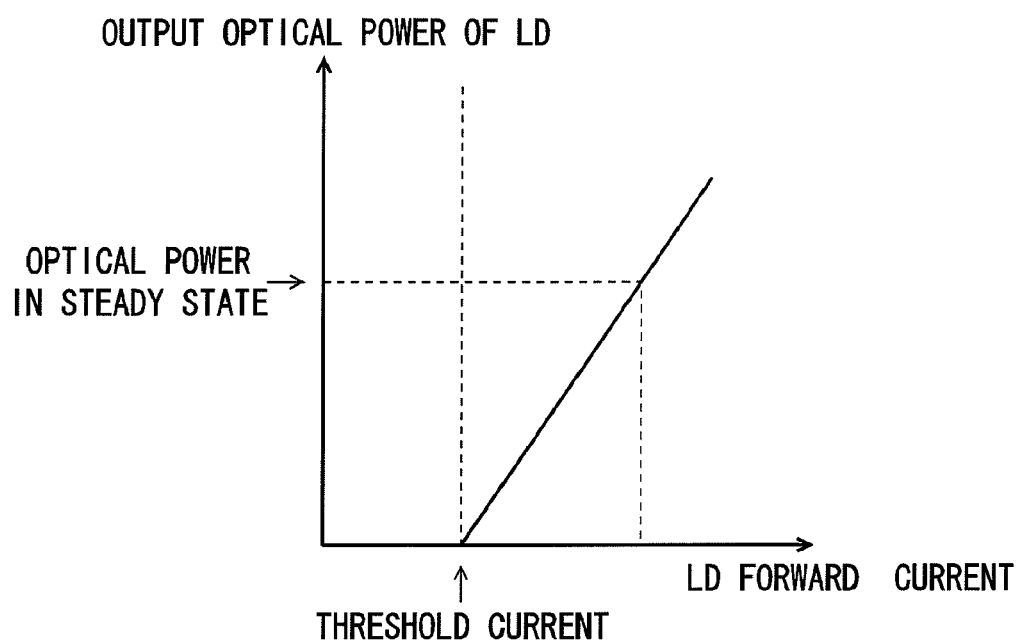
FIG. 10 is a graph showing a laser light emission characteristic of a laser diode.

Furthermore, as shown in FIG. 10, the output optical power of the LD 11 increases in proportion to the forward current flowing through the LD 11. Therefore, laser light having a steep rising edge is emitted during the period T2 (when the auxiliary current Ia flows through the auxiliary current path) of the transient period (see FIG. 2).

Figure 9:
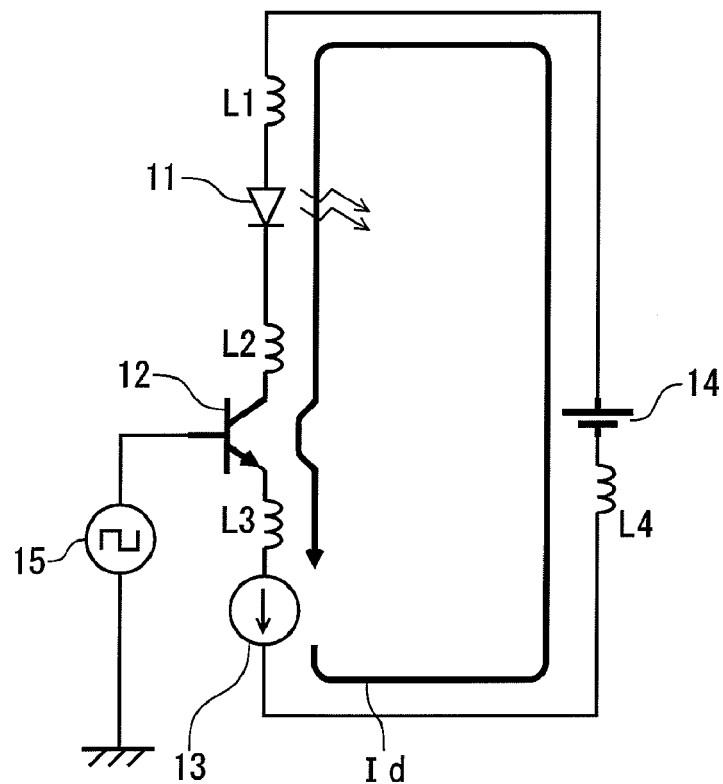
FIG. 9 is a circuit diagram showing the configuration of a related-art light pulse generator.

A steady state is established upon completion of the discharge of the capacitor C', and only a constant LD forward current Id flows through the forward current loop as in the related-art light pulse generator shown in FIG. 9 (a period T3 shown in FIG. 2).

When the modulation control signal which is supplied from the modulation control signal source 15 is changed from the high level to the low level, the transistor 12 is turned off and the forward current loop is opened. As a result, the LD forward current Id is shut off and the laser light emission from the LD 11 is stopped.

Figure 4:
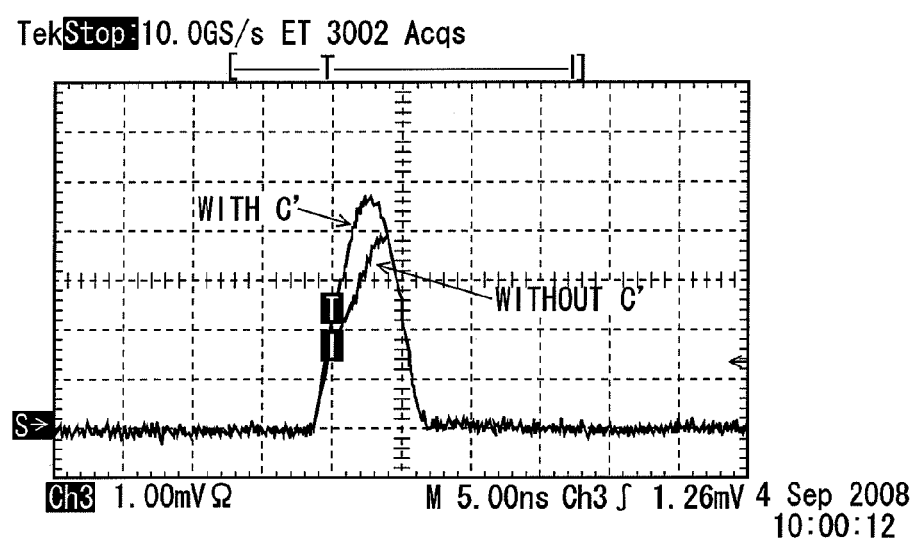
FIG. 4 shows laser light pulse waveforms of the circuit of FIG. 1 and the circuit of FIG. 9.

FIG. 4 shows laser light pulse waveforms of the case with the capacitor C' (circuit of FIG. 1) and the case without the capacitor C' (circuit of FIG. 9). As can be seen from FIG. 4, the rising edge of the light pulse is steeper in the case with the capacitor C' than in the case without the capacitor C'. The optical power level is increased by the auxiliary current Ia coming from the capacitor C'. Each of the waveforms of FIG. 4 is of a short light pulse and has no steady-state period T3.

As described above, since the auxiliary current path whose inductance is smaller than the series inductance L' of the forward current loop is formed by connecting the capacitors C1-C4 parallel with the LD 11, a light pulse having a steep rising edge can be emitted even if the current is increased to obtain a large optical power.

When the transistor 12 is turned on and a forward bias voltage starts to be applied to the LD 11 from the constant voltage source 14, the capacitor C' which is provided parallel with the LD 11 starts to be charged (period T1) because of the light emission forward voltage transient characteristic of the LD 11. When a forward current starts flowing through the LD 11, the capacitor C' starts to be discharged and causes an additional current to flow through the LD 11 in the same direction as the forward current (period T2). The auxiliary current coming from the capacitor C' which is parallel with the LD 11 is not affected by the inductances between the LD 11, the transistor 12, the constant current source 13, and the constant voltage source 14. Therefore, a current having a steep rising edge can flow through the LD 11, as a result of which a light pulse having a steep rising edge can be emitted.

Next, a description will be made of the voltage level of the constant voltage source 14 of the light pulse generator. As described above, the LD forward current Id which flows through the forward current loop is affected by the series inductance L' and hence by $\Delta Id/\Delta Ton$ (immediately after activation).

On the other hand, where a battery is used as a power source for driving the LD 11, the LD forward current Id is also prone to be affected by the saturation of the transistor 12. This will be described below. Immediately after turn-on of the transistor 12 (in the period when its differential resistance is large), a large voltage drop occurs between the two terminals of the LD 11. Where a commercial power line (100 V), for example, is used, it is easy to apply tens of volts (e.g., 30 to 50 V). On the other hand, in the case of battery driving (power source voltage: several volts to a little more than 10 V), the application voltage is at most several volts (e.g., 5 V).

Therefore, when a large voltage drop occurs between the two terminals of the LD 12, the voltage applied between the emitter and the collector of the transistor 12 is lower and the transistor 12 is saturated longer in the case of battery driving than in the case of using a commercial power line. That is, generation of a laser light pulse having a steep rising edge becomes more difficult as the voltage of the constant voltage source 14 becomes lower.

In the related art light pulse generator of FIG. 9 which is not provided with the auxiliary current circuit (capacitor C'), in the case of battery driving in which the application voltage is lower than in the case of using a commercial power line, immediately after power-on of the transistor 12, the transistor 12 is saturated because of the forward voltage transient characteristic of the LD 12. As a result, a rectangular-wave-shaped pulse current cannot flow through the LD 11.

On the other hand, where the auxiliary current circuit (capacitor C') is provided parallel with the LD 11, a current flows through the capacitor C' bypassing the LD 11 in the light emission transient period (the period T1 in FIG. 2) of the LD 11. As a result, the saturation time of the transistor 12 can be shortened and the waveform quality of a light pulse can be improved (i.e., the rising edge can be made steeper) even in the case of battery driving or the like.

A more detailed description will be made with reference to FIGS. 5-7.

Figure 5:
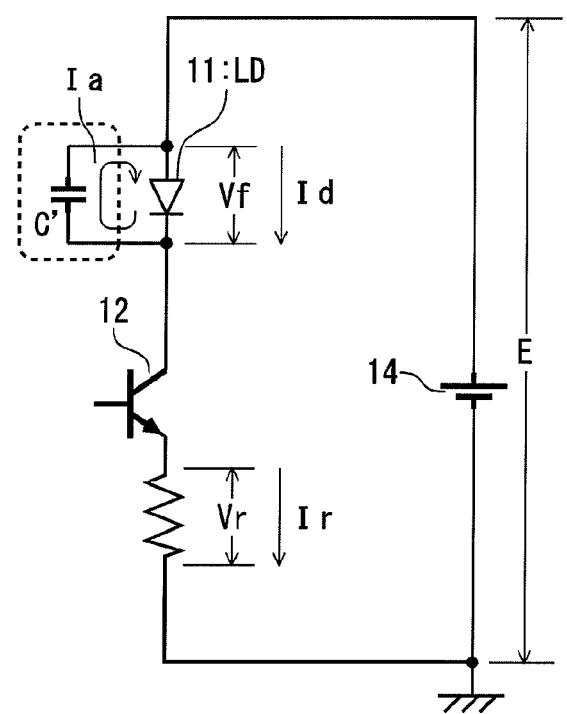
FIG. 5 is a circuit diagram illustrating low-voltage driving of the laser diode in the light pulse generator shown in FIG. 1.

FIG. 5 is a circuit diagram illustrating low-voltage driving of the LD 12 in the light pulse generator. To simplify the description, the inductances L1-L4, the constant current source 13, and the modulation control signal source 15 are omitted in FIG. 5. The voltage of the constant voltage source 14 is represented by E and the minus-side potential of the constant voltage source 14 is assumed to be 0 V. The voltage between the minus-side of the constant voltage source 14 and the emitter of the transistor 12 is represented by Vr, and the emitter current (in the direction from the transistor 12 to the minus-side of the constant voltage source 14) is represented by Ir. The forward voltage Vf, the auxiliary current Ia, and the LD forward current Id are defined in the same manners as in FIGS. 3A and 3B.

FIG. 6 schematically shows relationships between the forward voltage Vf, the emitter voltage Vr, the auxiliary current Ia, the current (Id+Ia) flowing through the LD 11, and the emitter current Ir. The horizontal axis represents time.

Figure 7A:
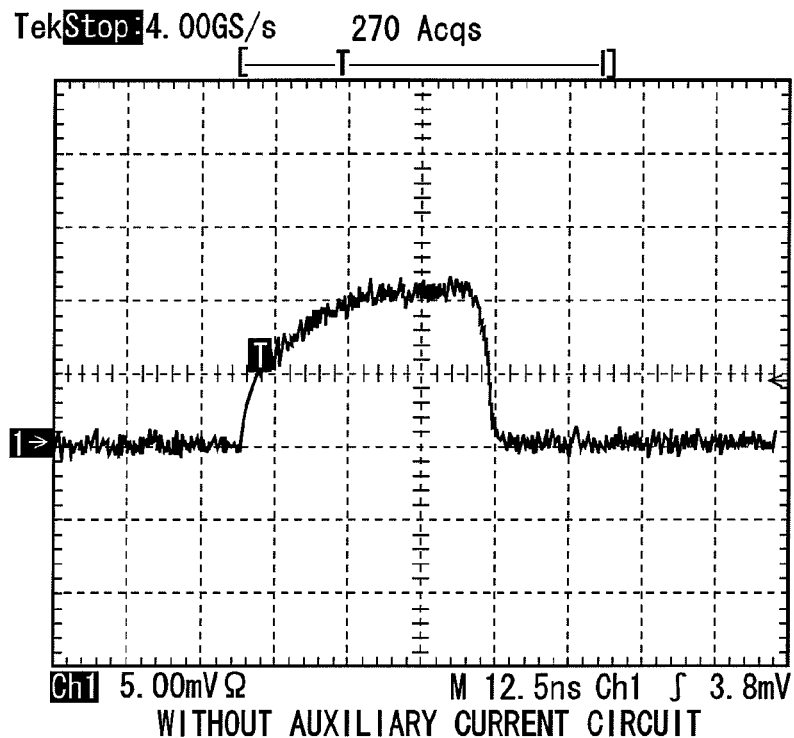
FIGS. 7A and 7B show laser light pulse waveforms of the light pulse generator of FIG. 9 and the light pulse generator of FIG. 1, respectively, in the case of low-voltage driving of the laser diode.
Figure 7B:
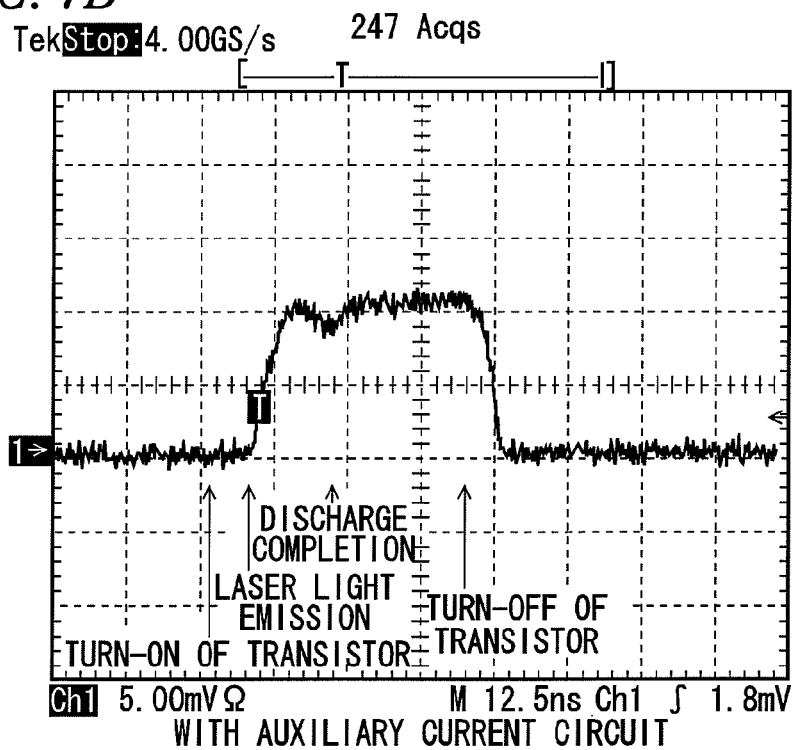

FIGS. 7A and 7B show actually measured light pulse waveforms of a case without the auxiliary current circuit (light pulse generator of FIG. 9) and a case with the auxiliary current circuit (light pulse generator of FIG. 1), respectively.

As seen from FIGS. 7A and 7B, the influence of the saturation of the transistor 12 can also be reduced and a light pulse having a steep rising edge can be emitted, because the auxiliary current Ia flows through the capacitor C' bypassing the LD 11 (along the path shown in FIG. 3A) in the transient period T1 (from the turn-on of the transistor 12 to the light emission of the LD 11) and then the auxiliary current Ia flows through the LD 11 in the same direction as the forward current while the capacitor C' is discharged (in the transient period T2).

Second Embodiment

Figure 8:
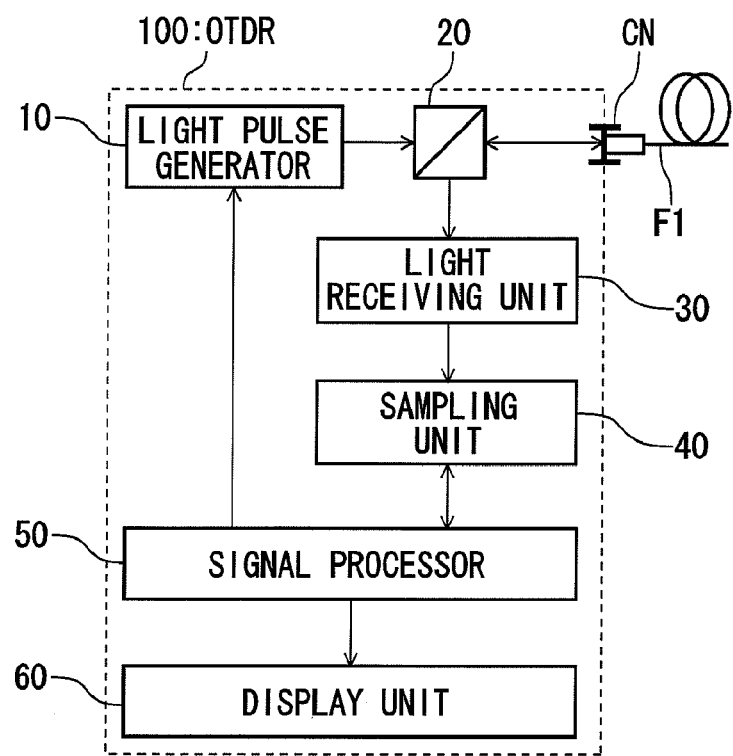
FIG. 8 is a block diagram showing the configuration of an optical time domain reflectometer using the light pulse generator of FIG. 1, according to another embodiment of the invention.

FIG. 8 is a block diagram showing the configuration of an OTDR which uses the light pulse generator of FIG. 1. In FIG. 8, a measurement subject optical fiber F1 is a line for transmitting an optical signal.

The OTDR 100 has, at the entrance/exit end, a measurement connector CN to which the measurement subject optical fiber F1 is connected. Light pulses are input to the measurement subject optical fiber F1 from the measurement connector CN. Return light beams (reflection light beams or back scattering light beams) of the light pulses that are input to the measurement subject optical fiber F1 are input to the OTDR 100 via the measurement connector CN.

The OTDR 100 is equipped with the light pulse generator 10 of FIG. 1, a directional coupler 20, a light receiving unit 30, a sampling unit 40, a signal processor 50, and a display unit 60. The light pulse generator 10 inputs light pulses to the measurement subject optical fiber F1 via the directional coupler 20 and the measurement connector CN according to an instruction from the signal processor 50.

The directional coupler 20 inputs light coming from the light pulse generator 10 to the measurement subject optical fiber F1 via the measurement connector CN, and supplies the light receiving unit 30 with return light coming from the measurement subject optical fiber F1 via the measurement connector CN.

The light receiving unit 30, which is an avalanche photodiode, for example, outputs a photocurrent corresponding to optical power of the return light.

The sampling unit 40 converts an electrical signal (photocurrent) supplied from the light receiving unit 30 into a voltage and samples it. The signal processor 50 causes the light pulse generator 10 to emit light pulses. The signal processor 50 causes the sampling unit 40 to perform sampling, and performs computation on a resulting electrical signal. The display unit 60 displays a processing result of the signal processor 50.

The operation of the above-configured OTDR 100 will be described below.

The signal processor 50 sets a light pulse width (i.e., an on-time of the transistor 12) in the modulation control signal source 15 of the light pulse generator 10 in advance. A timing generator (not shown) of the signal processor 50 sends timing signals to the modulation control signal source 15 at prescribed intervals. The modulation control signal source 15 turns on the transistor 12 in synchronism with the timing signals and thereby causes the LD 11 to emit light pulses. The light pulses emitted from the LD 11 are provided to the measurement subject optical fiber F1 via the directional coupler 20 and the measurement connector CN.

Rayleigh scattering occurs inside the measurement subject optical fiber F1, and part of scattering light goes in the direction that is reverse to the traveling direction of the input light pulse and returns to the OTDR 100 as return light. Fresnel reflection light that is generated at a connecting point or a breaking point of the measurement subject optical fiber F1 also returns to the OTDR 100.

The return light coming from the measurement subject optical fiber F1 enters the light receiving unit 30 via the measurement connector CN and the directional coupler 20. The light receiving unit 30 converts the received return light into an electrical signal (photocurrent) corresponding to optical power of the return light, and outputs the electrical signal to the sampling unit 40.

An I-V conversion circuit (not shown) of the sampling unit 40 converts the photocurrent supplied from the light receiving unit 30 into a voltage, and a multi-stage amplifier (not shown) of the sampling unit 40 amplifies the voltage. Then, an A-D conversion circuit (not shown) of the sampling unit 40 converts the analog electrical signal into a digital signal using, as a temporal reference, a timing signal supplied from the signal processor 50, and supplies the digital signal to the signal processor 50.

The signal processor 50 determines a time from the emission of the light pulse from the LD 11 to the detection of the return light by the light receiving unit 30 based on the output timing of the timing signal and the digital signal supplied from the sampling unit 40. The signal processor 50 thus measures distances in the measurement optical fiber F1 and levels of return light optical signals. Measurement results are displayed on the display unit 60 in such a manner that the horizontal axis represents the distance and the vertical axis represents the return light optical signal level.

Since the signal level of return light is very low, noise is reduced by inputting a light pulse repeatedly to the measurement subject optical fiber F1 and averaging plural measurement values with the signal processor 50.

Since as described above the measurement subject optical fiber F1 is tested by generating light pulses using the light pulse generator shown in FIG. 1, the dynamic range, the distance resolution, etc. can be increased and the measurement subject optical fiber F1 can be measured and tested accurately.

The present invention is not limited to the above embodiments and may be embodied in the following manners.

Although in the second embodiment the light pulse generator shown in FIG. 1 is used in the OTDR 100, it can be used in any measuring instruments which output a light pulse(s).

Although the four parallel capacitors C1-C4 are provided, a light pulse can be emitted faster (it can be given a steeper rising edge) by increasing the number of capacitors because the current that one capacitor can produce by discharge has an upper limit. However, the number of capacitors should be determined taking into consideration the circuit scale, the cost, the output optical power of the LD 11, the performance and characteristics of the LD 11, and other factors.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A light pulse generator comprising:
   a laser diode;
   a voltage source that applies a bias voltage to the laser diode;
   a switching element that causes the laser diode to emit a light pulse by directly modulating the laser diode; and
   an auxiliary current circuit which is charged immediately after turn-on of the switching element and which starts to discharge after a forward current flows through the laser diode so as to provide a auxiliary current to the laser diode in the same direction as the forward current
   wherein the auxiliary current circuit comprises at least one capacitor that is provided in parallel with the laser diode, and
   wherein an inductance of a current path through the laser diode and the at least one capacitor is smaller than a series inductance of a forward current loop through the laser diode, the switching element and the voltage source.

2. The light pulse generator according to claim 1, wherein said at least one capacitor comprises a plurality of capacitors that are provided in parallel with the laser diode.

3. An optical time domain reflectometer which provides a light pulse to an optical fiber and measures a characteristic of the optical fiber based on return light of the light pulse, coming from the optical fiber, the reflectometer comprising:
   the light pulse generator according to claim 1.

4. The light pulse generator according to claim 1,
   wherein the at least one capacitor is charged by a forward voltage from the voltage source in a first period, wherein a differential resistance of the laser diode immediately after turn-on of the switching element is smaller than that of the laser diode in a steady state in the first period, and
   wherein the at least one capacitor is discharged in a second period, wherein the forward voltage in the second period is small than the forward voltage in the first period due to transient characteristic of the forward voltage in light emission of the laser diode.

* * * * *